United States Patent [19]

Boryta et al.

[11] Patent Number: 4,771,246

[45] Date of Patent: Sep. 13, 1988

[54] METHOD FOR DETERMINING THE LOCATION OF A LEAK IN A POND LINER FORMED OF ELECTRICALLY INSULATING MATERIAL

[75] Inventors: Daniel A. Boryta, Downington; Patrick M. Brown, Exton, both of Pa.

[73] Assignee: Leak Sensors, Inc., West Hartford, Conn.

[21] Appl. No.: 932,799

[22] Filed: Nov. 20, 1986

[51] Int. Cl.$^4$ .................. G01R 31/12; G08B 21/00
[52] U.S. Cl. .................. 324/559; 324/557; 324/512; 340/605
[58] Field of Search ............ 324/551, 553, 554, 557, 324/558, 559, 541, 544; 340/603-606; 427/8, 9; 405/53, 54

[56] References Cited

U.S. PATENT DOCUMENTS

| | | | |
|---|---|---|---|
| 3,343,081 | 9/1967 | Lane | 324/558 |
| 3,810,007 | 5/1974 | Wiseman et al. | 324/557 X |
| 3,858,114 | 12/1974 | Voellmin et al. | 324/557 |
| 4,558,273 | 12/1985 | Nishimura | 324/558 |

OTHER PUBLICATIONS

Thomas Scientific Catalogue (198) p. 1753.
J. Protective Coatings and Linings, 3, No. 2, Feb. 1986, (p. 55).

Primary Examiner—Reinhard J. Eisenzopf
Assistant Examiner—Jack B. Harvey
Attorney, Agent, or Firm—Howson and Howson

[57] ABSTRACT

A system for determining the location of a leak in a pond liner made of electrically insulating material supported by a medium which is electrically conductive consists of a movable nozzle for directing a stream of an electrically conductive liquid against the liner, a ground electrode connected to the electrically conductive supporting medium exterior of the pond and liner, a current source connected between the nozzle and the ground electrode, and a galvanometer located in the electrical circuit comprising the nozzle, current source and ground electrode for monitoring at least one electrical property in the circuit when a change in an electrical property occurs as a result of the stream of electrically conductive liquid completing the circuit by contacting the supporting medium through a hole in the liner.

6 Claims, 1 Drawing Sheet

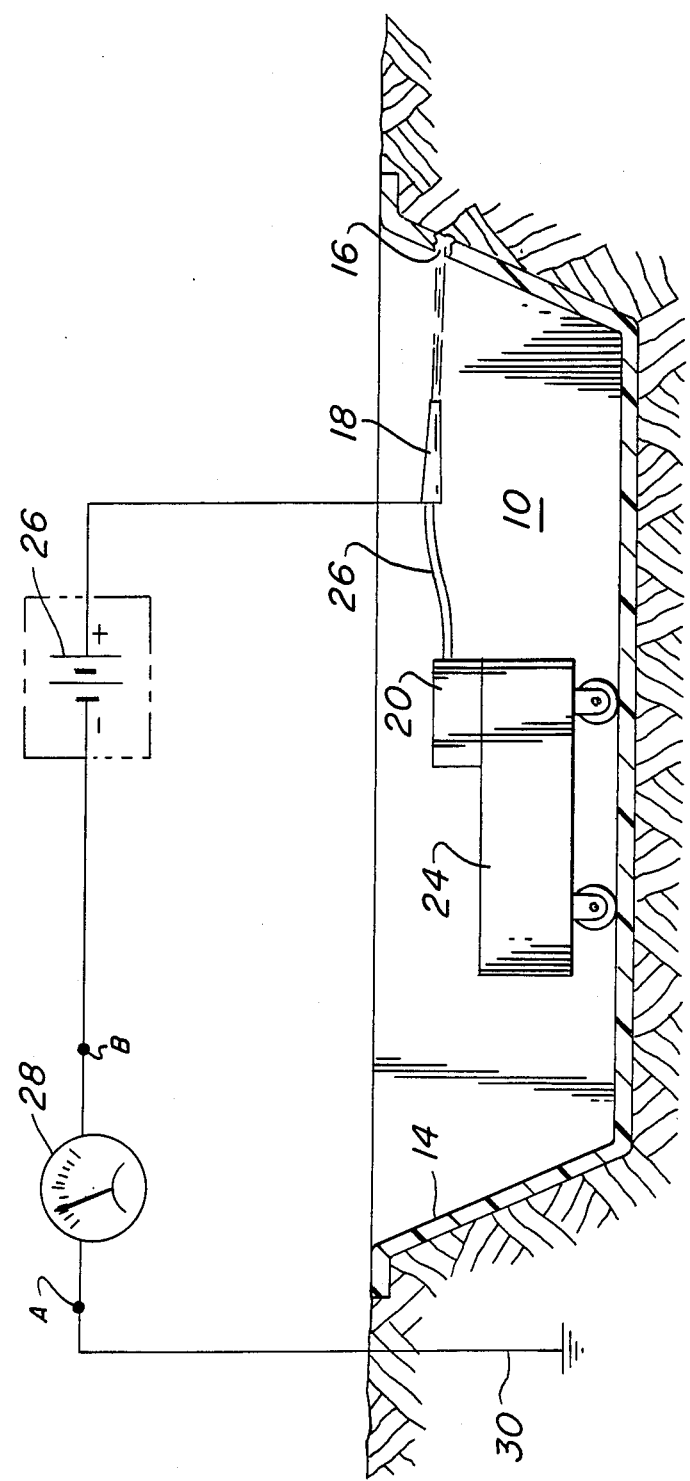

METHOD FOR DETERMINING THE LOCATION OF A LEAK IN A POND LINER FORMED OF ELECTRICALLY INSULATING MATERIAL

GENERAL DESCRIPTION OF THE INVENTION

1. Field of the Invention

The present invention relates generally to a system and method for detecting the location of a leak in a pond liner of electrically insulating material to prevent or minimize loss of the liquid contained in the pond, which liquid may contain a valuable material such as salt in a brine, or may be harmful to the environment by polluting the earth and ground water.

2. Background of the Invention

In the recovery of salt, such as lithium salt from a naturally occurring brine, the feasibility of the process depends upon solar evaportion of the brine in large earthen ponds to obtain a salt-rich slurry. Such ponds are of generally large size and may range from a few acres up to 30 or 40 acres. Because of the porosity of the soil, it is necessary to line the ponds with a plastic sheet material, an example of which is a 20 mil thick sheet of polyvinyl chloride in order to contain the brine. Since the brine is concentrated by solar energy to a manageable slurry over a period of many months, any leakage of the salt laden water through defects in the liner, such as those which frequently occur along seams joining adjacent strips of liner material, would compromise the effectiveness of the process in a devastating manner. It has been calculated that as few as six one inch long, narrow slits per mile of seams in a liner would make it unsuitable over the lengthy evaporation cycle.

Man-made waste disposal ponds for storage of environmentally hazardous materials, such as chemical wastes, are commonly used today. These ponds are usually lined with polymeric sheet material to prevent the hazardous chemicals from contaminating earth and ground water.

A particularly serious problem is contamination of ground water with gasoline and other liquid petroleum fuels by reason of leaks in underground storage tanks. Estimates from government and industrial sources are that between 1.25 and 3.5 million underground storage tanks exist in the nation and that from 75,000 to 100,000 are leaking. In addition, it is estimated that as many as 350,000 other may develop leaks in the next few years. In view thereof secondary containment liners for underground petroleum storage tanks are being used, and it is important that such in ground liners, which are made of hydrocarbon-resistant polymeric material, also be free of leaks.

A system and method for detecting leaks in ponds and secondary containment liners are disclosed in U.S. Pat. No. 4,543,525. Broadly, the invention of that patent comprises a pond with a liner made of a sheet of electrically insulating material supported by a medium which is electrically conductive; introducing electrode means to the pond to establish an electric potential between an electrically conductive fluid within the pond and the supporting medium; introducing to the pond detector means comprising a pair of electrically connected, spaced, electrically conductive probes having associated therewith means for measuring the electric current flowing through the probes; aligning the probes with respect to the electrode means to obtain a maximum current reading by the current measuring means, and causing the probes of the detector means to traverse over the bottom of the pond adjacent the liner in a direction away from said electrode means until a point is reached where the current substantially changes in value and which thereby is indicative of the leak location beneath one of said probes.

Unfortunately the leak detecting system of that patent does not readily lend itself to the location of leaks in those portions of a liner forming the walls of the containment pond. In addition, such prior known leak detection system requires that the pond contain some depth of electrically conductive fluid, and thus the system is not suitable for locating leaks prior to filling the pond with such fluid.

There has also been developed an instrument for detecting pinholes and flaws in coatings on a conductive substrate, e.g. a resin coated metal tank wall or pipe. The instrument is battery powered and uses the "wet sponge" method in which a low voltage is passed through a damp sponge which is run across the coating to be tested. If a flaw is encountered, the current is conducted to the substrate and an audio alarm sounds. In order to operate properly, the sponge must come in direct contact with the conductive substrate and the use of such instrument is labor intensive in large pond applications.

It is a primary object of this invention to provide an improved method for determining the location of leaks in pond liners formed of electrically insulating sheet material.

A particular object of this invention is to provide a relatively simple and inexpensive system and method for detecting leaks in those portions of a pond liner of electrically insulating sheet material forming the walls of a containment pond.

Another object of this invention is to provide a method and system for detecting potential leaks in pond liners of electrically insulating polymer sheet material prior to introducing to the pond the liquid to be retained therein.

These and other objects of this invention will become apparent from the following detailed description, appended claims and accompany drawing.

BRIEF DESCRIPTION OF THE DRAWING

The FIGURE is a schematic view illustrating one suitable form of the leak detecting system of the invention.

DETAILED DESCRIPTION OF THE INVENTION

Broadly, the invention comprises providing a pond or an in ground hole for a storage tank with a liner made of a sheet of electrically insulating material supported by a medium, generally the earth, which is electrically conductive, providing movable nozzle means for directing a stream of an electrically conductive liquid against the liner at a predetermined area, such as the pond walls; providing a ground electrode which is connected to the electrically conducting supporting medium exterior of the pond and liner, connecting the nozzle means and ground electrode to a current source, and providing monitoring means in the electrical circuit comprising the nozzle means, current source and ground electrode for monitoring at least one electrical property in the circuit when a change in the electrical property occurs as a result of the stream of electrically conductive liquid completing the circuit by contacting the supporting medium through a leak in the liner.

Referring to the drawing in detail, which is a schematic view illustrating one suitable electrical system by which the method of the present invention may be carried out, and wherein a leak in a pond liner is located by means of a continuous stream of electrically conductive liquid, it may be seen that a pond 10 is formed in the soil 12. The pond may be formed by any suitable method as for example by use of conventional earthworking equipment. The pond 10 is provided with liner 14, the purpose of which is to prevent fluid in the pond from soaking into the soil beneath the pond. The liner generally will comprise a sheet of polymeric material which is electrically insulating, such as polyvinyl chloride, having a thickness on the order of about 20 to 80 mils. In the case of liners for petroleum storage tank holes and in other instances where a corrosive chemical is to be contained in a pond or the like, the liner should be made of a chemically resistant polymer such as a polyester elastomer sold under the trademark HYTREL ® by E. I. du Pont de Nemours & Co. Inasmuch as ponds designed for the evaporation of brines may be several acres in size, the liners therefor ordinarily will be comprised of a number of strips of polymeric sheet material bonded together in an overlapping relation along their adjacent longitudinal edges. As noted previously, it is these seams which are a particularly annoying source of leaks. In the drawing a leak in the liner 14 is designated by the numeral 16.

The supporting medium for the pond liner is usually earth. In the event the soil at the pond sight is of low electrical conductivity a light spray of an aqueous salt solution over the surface of the earth substrate which defines the pond is recommended to increase the electrical conductivity thereof and provide good continuity with a ground electrode. An alternative method for obtaining a ground circuit as to provide the exterior side of the liner with a layer of a conductive metal, e.g. alumium foil.

A particularly preferred leak detection system of this invention is illustrated in the drawing and comprises movable nozzle means consisting of a nozzle 18 which is connected to a pump 20 for pumping liquid by means of a hose 22. Pump 20 can be driven by an electric motor, a gasoline engine, or other means, not shown. However, care must be taken to ensure that there is no electrical continuity between the pump and ground electrode. The capacity of the pump need not be very great provided it is sufficient to generate a continuous stream of liquid which will travel sufficiently far in substantially unbroken form to enable it to contact the liner at some distance from the nozzle, generally several feet. This is particularly important where the presence of leaks in the liner forming the walls of a pond or tank hole is being determined and the wall height is substantial.

Any type of standard nozzle which is capable of creating a continuous stream of liquid under pressure may be used, and the nozzle should be so designed as to make an electrical connection with the stream of electrically conductive fluid flowing through the nozzle. Nozzles having a diameter of from about ½ in. to about 2 inches are generally satisfactory for use in the system.

The electrically conductive fluid may be stored in a tank 24 or other container, and if the pond contains a conductive liquid such may be used. The pump 20 and tank 24 should be electrically insulated from ground in order to avoid the obtaining of false readings. Particularly preferred are storage tanks and pumps comprised of electrically insulating material such as those made of resin reinforced with glass fibers.

The nozzle 18 is electrically connected to a battery or other current source 26, means 28 for monitoring at least one electrical property in the electrical circuit consisting of the nozzle 18, current source 26 and ground electrode 30 which is located exterior of the pond 10 and liner 14, when the circuit is completed by the continuous stream of electrically conductive liquid form the nozzle 18 contacting the electrically conductive supporting medium, e.g. soil, through a hole 16 in the liner 14.

The monitoring means which is connected in the system through terminals A and B may provide a visual response, as would be produced by a galvanometer, or an audio response, such as that produced by a high impedance continuity meter. The present invention does not reside in any particular audio circuit and other circuity may be used.

In use, the tank 24 is filled with an electrically conductive fluid such as an aqueous solution of an ionizable inorganic salt, e.g. a sodium chloride solution. The concentration of the ionizable salt solution should be sufficient to provide the solution with maximum resistivity of about 10,000 ohm-cm., using a voltage source not exceeding about 30 volts, preferably about 9 volts, in order to ensure the safety of personnel operating the system.

The following example illustrates further the method and system of this invention.

EXAMPLE I

A wall of clear rigid plastic approximately 3 mils thick was constructed and a hole approximately 1 mm in diameter was made in the wall about 2 feet above the bottom of the wall. The wall was placed in a flat pan so as to stand in a rigid upright position. Exterior of the outer surface of the wall and extending into the pan where paper towels saturated with water containing about 1 percent of weight of sodium chloride. A small layer of the salt solution with which the paper towel layer was in contact was maintained in the bottom of the pan. One lead of an audio continuity meter (Radio Shack Cat. No. 277-1014) powered by a 9 volt battery was connected to ground, i.e. the pan, so as to be in electrical contact withthe salt solution in the pan, and the other lead was connected to the metal needle of a metal and glass hypodermic syringe. When a solid stream of the 1 percent salt solution from the hypodermic syringe was squirted into the hole in the plastic wall of the test sytem, the meter made a sound indicating completion of the circuit by means of the of salt solution coming into electrical contact with the towels saturated with such salt solution located on the exterior side of the wall at the location of the hole.

We claim:

1. In a pond having a liner made of electrically insulating material and having an interior face and an exterior face, and an electrically conductive medium in contact with said exterior face and supporting the liner, a system for determining the location of a leak in said liner which comprises:

(a) means, including a movable nozzle, for directing a stream of an electrically conductive liquid from said nozzle against any chosen location on the interior face of said liner, (b) a ground electrode connected to said electrically conductive supporting medium exterior of said pond and liner, (c) a current source connected between said nozzle and said ground electrode, and (d) monitoring means located in the electrical circuit comprising said nozzle, current source and ground electrode for indicating an increase in the current in said circuit which occurs when said stream of electrically conductive liquid completes the circuit by contacting said supporting medium through a hole in said liner.

2. The leak detection system of claim 1 in which said monitoring means provides a visual response to an increase in the current in said circuit.

3. The leak detection system of claim 1 in which said electrically conductive liquid comprises an aqueous salt solution.

4. The method for determining the location of a leak in a pond liner made of a sheet of electrically insulating material supported by a medium which is electrically conductive which comprises simultaneously:

(a) directing a stream of an electrically conductive liquid from movable nozzle means against said liner and moving said stream across the surface of said liner, (b) applying an electrical potential difference to the liquid stream and said electrically conducting supporting medium by means of an electrical current source connected to the liquid stream and to said supporting medium, and (c) monitoring the current in the electrical circuit comprising said stream, said current source and said supporting medium, whereby a leak may be located when an increase in said current occurs as a result of said electrically conductive liquid completing the circuit by contacting said supporting medium through a hole in said liner.

5. The method of claim 4 in which said monitoring means provides a visual response to an increase in the current in said circuit.

6. The method of claim 4 in which said electrically conductive liquid comprises an aqueous salt solution.

* * * * *